US012561498B2

(12) United States Patent
Ma et al.

(10) Patent No.: US 12,561,498 B2
(45) Date of Patent: Feb. 24, 2026

(54) GaN DISTRIBUTED RF POWER AMPLIFIER AUTOMATION DESIGN WITH DEEP REINFORCEMENT LEARNING

(71) Applicant: Mitsubishi Electric Research Laboratories, Inc., Cambridge, MA (US)

(72) Inventors: Rui Ma, Carlisle, MA (US); Mouhacine Benosman, Boston, MA (US); Yuxiang Sun, Cambridge, MA (US)

(73) Assignee: Mitsubishi Electric Research Laboratories, Inc.

( * ) Notice: Subject to any disclaimer, the term of this patent is extended or adjusted under 35 U.S.C. 154(b) by 687 days.

(21) Appl. No.: 17/934,238

(22) Filed: Sep. 22, 2022

(65) Prior Publication Data

US 2023/0401363 A1      Dec. 14, 2023

Related U.S. Application Data

(60) Provisional application No. 63/351,693, filed on Jun. 13, 2022.

(51) Int. Cl.
*G06N 3/092* (2023.01)
*G06F 30/27* (2020.01)
(Continued)

(52) U.S. Cl.
CPC .......... *G06F 30/27* (2020.01); *G06F 30/3308* (2020.01)

(58) Field of Classification Search
CPC ............... G06F 30/323; G06F 2117/12; G06F 2119/06; G06F 30/27; G06F 30/373;
(Continued)

(56) References Cited

U.S. PATENT DOCUMENTS

2019/0286979 A1*  9/2019  Harmer ................... G06N 3/092
2022/0266145 A1*  8/2022  Gisslén ................... G06N 3/047

OTHER PUBLICATIONS

Settaluri et al., AutoCkt: Deep Reinforcement Learning of Analog Circuit Designs, IEEE, 2020, pp. 490-495 (Year: 2020).*

(Continued)

*Primary Examiner* — Nghia M Doan
(74) *Attorney, Agent, or Firm* — Gene Vinokur

(57) ABSTRACT

A computer-implemented method is provided for training multi RL agent networks generating device parameters of circuits. The method includes acquiring inputs with respect to a desired circuit specification of a circuit, a device parameter, a topology of the circuit, a final state corresponding to a maximum step, wherein the desired circuit specification includes a gain, bandwidth, phase margin, power consumption, output power and power efficiency, wherein each of the RL agent networks is configured to perform transmitting an action selected from a set of actions to an environment module, updating the device parameters of the circuit with respect to a circuit specification, obtaining a current specification of the circuit by simulating a netlist of the circuit based on the updated device parameters using a circuit simulator of the environment module, wherein the environment module includes the netlist of the circuit, acquiring a reward from the environment module, wherein the reward is computed based on a difference between the current specification and the desired specification, wherein the steps of the transmitting, updating, obtaining and acquiring are continued until the reward reaches to a threshold value or a number of steps reach a preset value, and generating the satisfied updated device parameters via the interface.

7 Claims, 8 Drawing Sheets

(51) Int. Cl.
    *G06F 30/3308*     (2020.01)
    *G06F 30/373*     (2020.01)

(58) Field of Classification Search
    CPC .......... G06N 3/045; G06N 3/08; G06N 3/006;
           G06N 3/0464; G06N 3/065; G06N 3/09;
                  G06N 3/092; G06N 20/00
    See application file for complete search history.

(56) References Cited

OTHER PUBLICATIONS

Wang et al., GCN-RL Circuit Designer: Transferable Transistor Sizing with Graph Neural Networks and Reinforcement Learning, DAC, 2020, pp. 1-6 (Year: 2020).*

Campbell, Charles, et al. "A wideband power amplifier MMIC utilizing GaN on SiC HEMT technology." IEEE Journal of Solid-state circuits 44.10 (2009): 2640-2647.

Schulman, John, et al. "Proximal policy optimization algorithms." arXiv preprint arXiv:1707.06347 (2017).

Chao, Y. U., A. Velu, and E. Vinitsky. "The surprising effectiveness of PPO in cooperative, multi-agent games." arXiv preprint arXiv:2103.01955 (2021).

Weidong et al. Domain Knowledge Infused Deep Learning for Automated Analog Radio Frequency Circuit Parameter Optimization. ARXIV.org. May 17, 2022, p. 1-7.

Anonymous, Multi Agent Reinforcement Learning, Jun. 9, 2022, p. 1-6, XP093077637. https://en.wikipedia.org/w/index.php?title-multi-agent_reinforcement_learning&oldid=1092256062.

Xueguang et al. Contrastinv Centralized and Decentralized critics in multi agent reinforcement learning, ARXIV.org. Dec. 2, 2021.

* cited by examiner

| | S21mean (dB) | S21min (dB) | S21var (dB) | S11mean (dB) | S22mean (dB) | flatness (dB) |
|---|---|---|---|---|---|---|
| Training | [6,8] | [5,7] | [2,4] | [-9,-5] | [-9,-5] | [4,6] |
| RL agent | 8.4 | 6.7 | 1.3 | -10.4 | -5.8 | 4.0 |
| Manual | 8.2 | 5.9 | 2.0 | -10 | -6.5 | 4.2 |

FIG. 5

GaN DISTRIBUTED RF POWER AMPLIFIER AUTOMATION DESIGN WITH DEEP REINFORCEMENT LEARNING

The present invention is generally related to Radio Frequency circuits design, and in particular to the circuits of distributed structure.

BACKGROUND

Radio Frequency (RF) circuits manual design has been notoriously complicated, especially for ultra-wide band and high frequency applications, which typically demands complex techniques to meet design requirements, but also introduces more devices as well, making the tuning job extremely exhaustive. As the result, RF circuits design demands more intensive iterations for achieving subtle trade-offs among specifications, which typically relies on designers' good initiation and rich tuning experiences; furthermore, textbook design theory is found to fall short for quite effectively analyzing the coupling effect between all the circuit elements in practical design. Most existing electronic design automation (EDA) software tools only provides limited design assistance with traditional techniques, requires time-consuming iterations, and even fails in handling high complexity. Unlike analog circuits processing low-frequency signals, the design cycle is relative shorter, thus the need of smarter design tools for RF circuits has ever been increasing.

Some recently proposed RL-based circuits automation design methods, e.g. Proximal policy optimization (PPO) and deep deterministic policy gradient (DDPG)-based methods, are able to learn optimal policy and find the device parameters to satisfy design goals. However, most aforementioned methods are realized for analog circuits, where the algorithms are not supposed to suffer from the curse of complex correlation across devices caused by high-frequency effect. Furthermore, all the prior RL works are built with a single agent as the representation of a whole circuit or system, which is hard to scale up to more complex cases with dozens of parameters system, also limits the applications to distributed circuits, like distributed power amplifier mainly discussed in this invention.

SUMMARY OF THE INVENTION

Some embodiments of the present invention are based on recognition that a target RF circuit with distributed structure could be decomposed into several identical components from domain knowledge, but with each component playing different role in the whole picture. Our automation design is based on Multi-agent Reinforcement Learning (MARL) implemented in the manner of centralized training decentralized execution (CTDE), by applying one on-policy actor-critic method PPO In specific, each circuit component is represented by one agent (also called actor in PPO), encoded as a graphical convolutional neural network (GCN), where each device is represented as a node, incorporating circuit specific information. The hidden features extracted from actors are fed into the "critic" network as input, and through a graphical attention network (GAN), in which each agent is modeled as one node, to capture the frequency and impedance-related correlations between agents. In training scenario, all the agents (actors) update their policy with SGD (Stochastic Gradient Descent) by referring to the estimated state value from their shared "critic" network, which works as central information channel to provide global guideline of policy iteration. Therefore, this training manner is called "centralized training". However, in deployment, the critic is going to be disregarded and all agents act independently based on one's own observations, called "decentralized execution".

Some embodiments of the present invention are based on recognition that the automated design of RF circuits is a longstanding challenge. We provide a deep reinforcement learning (RL) framework to assist the design of RF circuits at the pre-layout level, where the goal is to find device parameters to fulfill the desired specifications. Different from those prior works, our multi-agent reinforcement learning model provides an insightful learning scheme in circuits of distributed characteristic and demonstrates efficient way of decomposing complex circuits or systems for a faster learning.

According to some embodiments of the present invention, a computer-implemented method is provided for training a multi-agent reinforcement learning (RL) network generating device parameters of circuits. The method uses a processor coupled with a memory storing instructions implementing the method, wherein the instructions, when executed by the processor, carry out at steps of the method, comprising: acquiring inputs with respect to a desired circuit specification of a circuit, device parameters of the circuit, a topology of the circuit, a final state corresponding to a maximum step, wherein the desired circuit specification is represented by a gain, bandwidth, phase margin, power consumption, output power and power efficiency, or part of combination thereof, wherein each of the multi-agent RL network is configured to perform steps of: transmitting an action selected from a set of actions to an environment module that includes a netlist of the circuit; updating the device parameters of the circuit with respect to the desired circuit specification according to the selected action using a data processor of the environment module, wherein the action changes each of the device parameters by a minimum unit value of each device parameter; obtaining a current circuit specification of the circuit by simulating the netlist of the circuit based on the updated device parameters using a circuit simulator of the environment module; acquiring a reward from the environment module, wherein the reward is computed based on a difference between the current circuit specification and the desired circuit specification, wherein the steps of the transmitting, updating, obtaining and acquiring are continued until the reward reaches to a threshold value or a number of the steps reach a preset value; and storing the updated device parameters into the memory.

Further, an embodiment of the present invention can provide a computer-implemented method for generating device parameters of circuits using a pretrained multi-agent reinforcement learning (RL) network. The method uses a processor coupled with a memory storing instructions implementing the method, wherein the instructions, when executed by the processor, carry out at steps of the method, comprising: acquiring, via an interface, inputs with respect to a desired specification of a circuit, device parameters, a topology of the circuit; providing the inputs to the pretrained multi-agent RL network, wherein each of the desired circuit specification is represented by gain, bandwidth, phase margin, power consumption, output power and power efficiency; and generating a circuits represented by a graph modeling the topology of the circuit and the device parameters of the circuit, updated device parameters of the circuit.

Some Highlights of this Invention:

This current invention proposes a multi-agent reinforcement learning framework capable of automatically designing non-uniform distributed power amplifier with arbitrary number of cells based on the semiconductor technology GaN.

This current invention presents two-level graphical model embeddings. The low-level model embedding is implemented with GCN (graphical convolutional Network), as individual policy network for each agent's decision making, proved as good representation of neighboring connectivity, mutual effect between device nodes. The high-level embedding with GAN (graphical attention network) takes abstract features from all agents, which are extracted hidden features from GCN embedding, to estimate the state value, as the directions of where to go for agents' learning better policy. GAN is expected to figure out which part plays with more importance via its internal attention mechanism, which is reflected as the importance of cell agents. Further, the current invention introduces one implicit or soft constraint on device parameters, which comes from domain knowledge for speeding up agents' learning rate, formulated as one regularization term in cost function. Different from existing constraints based on psychical rules, where constraints present as penalty in reward function or transformation of formula as input features, which is hard constraint, potentially brings with disturbance in learning smoothness.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 5 shows a table of specification (Scattering parameters or S-parameters) for 3-cell non-uniform distributed power amplifier, according to some embodiments of the present disclosure;

DETAILED DESCRIPTION

Figure 1:
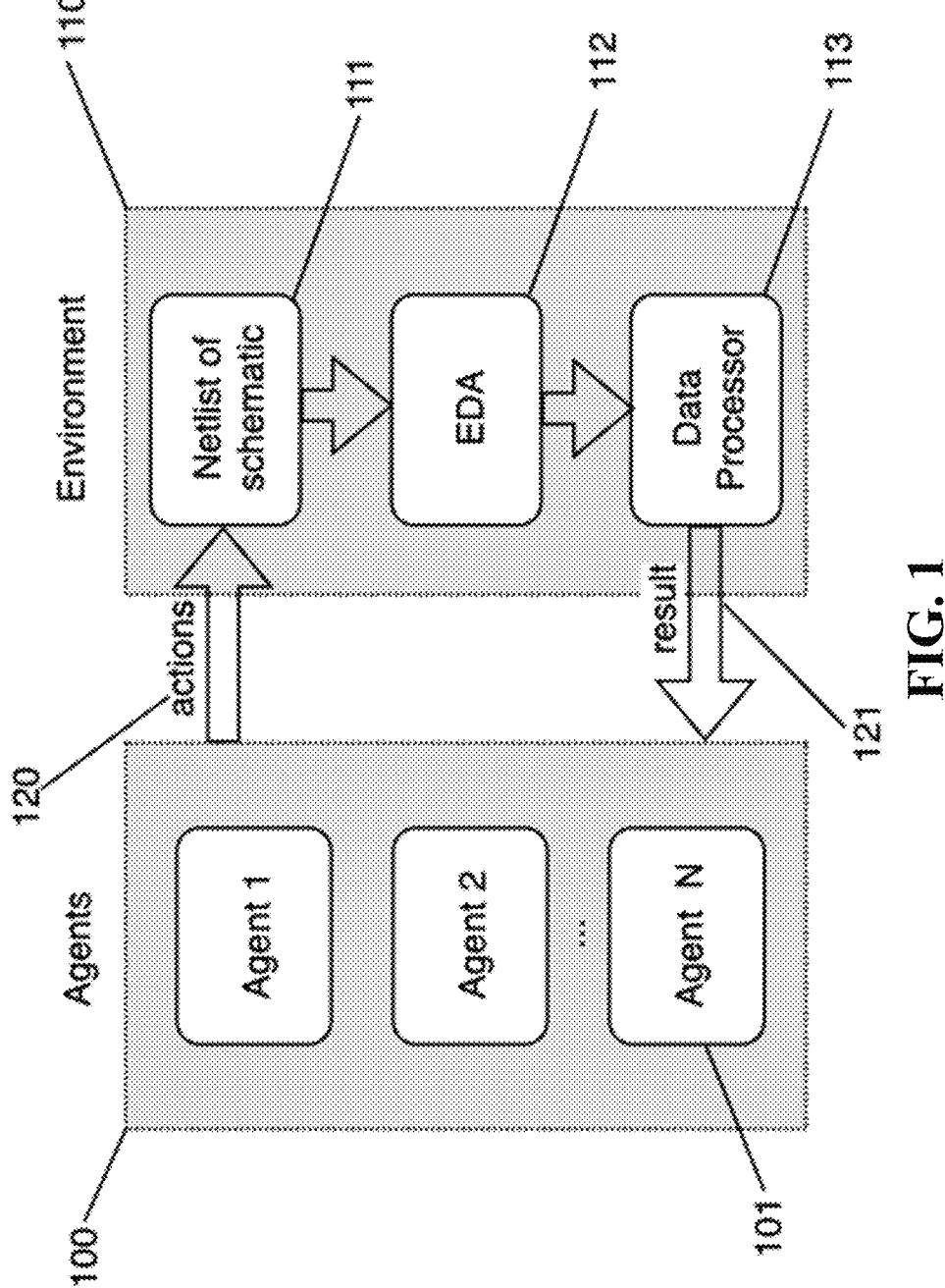
FIG. 1 shows a schematic diagram illustrating an overview of the multi-agent RL framework for automated design of RF circuits, according to embodiments of the present invention.

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary details to avoid obscuring the embodiments. Further, like reference numbers and designations in the various drawings indicated like elements.

Design automation of RF circuits can be best formulated as a parameter-to-specification (P2S) optimization problem. The goal is to find the optimal device parameters (e.g., width and length of transistors) to meet the desired circuitry specifications. In this case, the desired circuit specifications can be represented by a gain, bandwidth, phase margin, power consumption, output power, and power efficiency, or part of combinations thereof. Conventionally, these device parameters are manually derived based on the experiences and knowledge of IC designers about the circuits. Such empirical approaches aim to connect the circuitry specifications and the device parameters with equations through simplified physical models of devices and circuits. Manual tuning those equations is labor-intensive due to the highly nonlinear properties of RF circuits. Various design automation techniques have been presented in recent years, especially as the fast development of machine learning algorithms. Traditional optimization algorithms methods include Geometric Programming, Genetic Algorithms, and Simulated Annealing, where a well-designed sampling strategy is executed in each parameters iteration to speed up the convergence to global optimal. Differently, in the emerging machine-learning-based methods work, typically a well-trained neural network model to learn the complicated relations between device parameters and circuit specifications, for device parameters prediction in supervised learning and policy approximation in reinforcement learning-based methods, suggesting optimal tuning directions. The circuit specifications may include a gain, bandwidth, phase margin, power consumption, output power and power efficiency.

Learning with Graph Neural Networks

Electronic circuit is naturally well-suited for graphical representation, which captures the interplay between nodes. Graph neural networks, such as graph convolutional network (GCN) and graph attention network (GAN) are two generalized proposals, which have been applied broadly to various problems solving. Our current invention employs dual-level graphical representations in multi-agent RL model embedding, aiming to capture the physical and electrical connections. At the low-level, the graph reflects internal relations within one distributed PA cell and encoded into the policy approximator for each agent at the level of algorithm. The high-level graph is to embed the correlations between agents (PA cells) for the estimation of state value. The graph selections for each level may differ from case to case, which depends on if near or distant neighbors' coupling affects more. Intuitively, GCN can directly capture local correlation, while GAN performs better on global correlation.

Problem Statement

In the present disclosure, we target the design automation of distributed RF circuits at the pre-layout level, in which the goal is to efficiently search for optimal device parameters to meet the desired specifications. We are handling the cases where the topology of an RF power amplifier circuit is scalable from its nature distributed structure.

Overview of the current invention of multi-agent RL framework for non-uniform distributed power amplifier (NDPA) automation design is described as follows. The RL algorithm is based one actor-critic policy gradient method PPO (Proximal Policy Optimization), and the agents' policy updating is implemented in the well-known way of centralized training decentralized execution (CTDE). The environment 110 consists of three components: a netlist 111, an EDA simulator (circuit simulator) 112, and a data processor 113. The netlist of a circuit with a given topology is generated first, which is determined by the selected number of cells. The EDA simulator takes in the netlist and computes the electrical performance. The simulation results are processed as readable data and passed to agents as the feedback signal from environment. At each time step, all agents are prompted to output confident action choices $a_i$ to update each one's device parameters according to the state si and reward $r_i$ received from the environment.

Multi-Agent Reinforcement Learning Framework

Collaborating: exchanging part of designing results, circuit amp distributed.

The follow paragraphs describe the embodiment of our multi-agent reinforcement learning approach for a N-cell non-uniform distributed power amplifier automation design.

FIG. 1 illustrates the framework of Multi-agent Reinforcement Learning (MARL), which consists of the following key elements. Agents 100 may include a group of N agents 101, with each agent corresponding to a specific PA cell in nonuniform distributed power amplifier (NDPA), who also play as the decision makers in suggesting optimal solution. Action spaces can be a union set of executable actions 120. The actions can be represented by increasing, decreasing, or keeping the parameters of each device by all the agents 100. State spaces can be a set of possible states corresponding to the schematics with different device parameters, including the information of device parameters 111 and obtained specifications from data processor 113. Reward can be a scalar value computed by a well-crafted reward function, as the quantity of simulation results 121 from data processor 113. Environment 110 includes the physical world in which the agent operates (i.e., high-fidelity circuit simulation environment 112). A netlist 111 of given NDPA circuits is fed into a simulator (electronic design automation: EDA) 112, and the simulated results are processed by the data processor 113.

In the MARL training, agents 100 are configured to interact with the environment 110 including thousands of episodes for collecting data. In each episode, a random specification is sampled, and the circuit is initialized by a start state so. The terminated state $s_T$ is defined as either a solution is reached, or a maximum number of time step is reached. At the time step of t, by reading the state $s_t$, all agents take actions simultaneously to maximize the reward as their common goal, the $n^{th}$ agent's action is denoted as $a_t^n$. After the actions are taken, a new set of device parameters are automatically generated as the input of a new round of simulation. And then, an associated reward is output from the environment $R_t$, and the state transitions to the next one $s_t+1$. The agents iterate through the episode with multiple steps and accumulates the reward at each step until the goal is met or the total of T steps reach a preset value indicating a maximum number of steps of T, where the state can be the final state. The training stops according to a pre-defined criterion, e.g. when the averaged episodic reward is above a threshold value (for instance, 8), or 30% design goals could be reached within the maximum episode length, which is typically empirical.

Agents Decomposition

Figure 2:
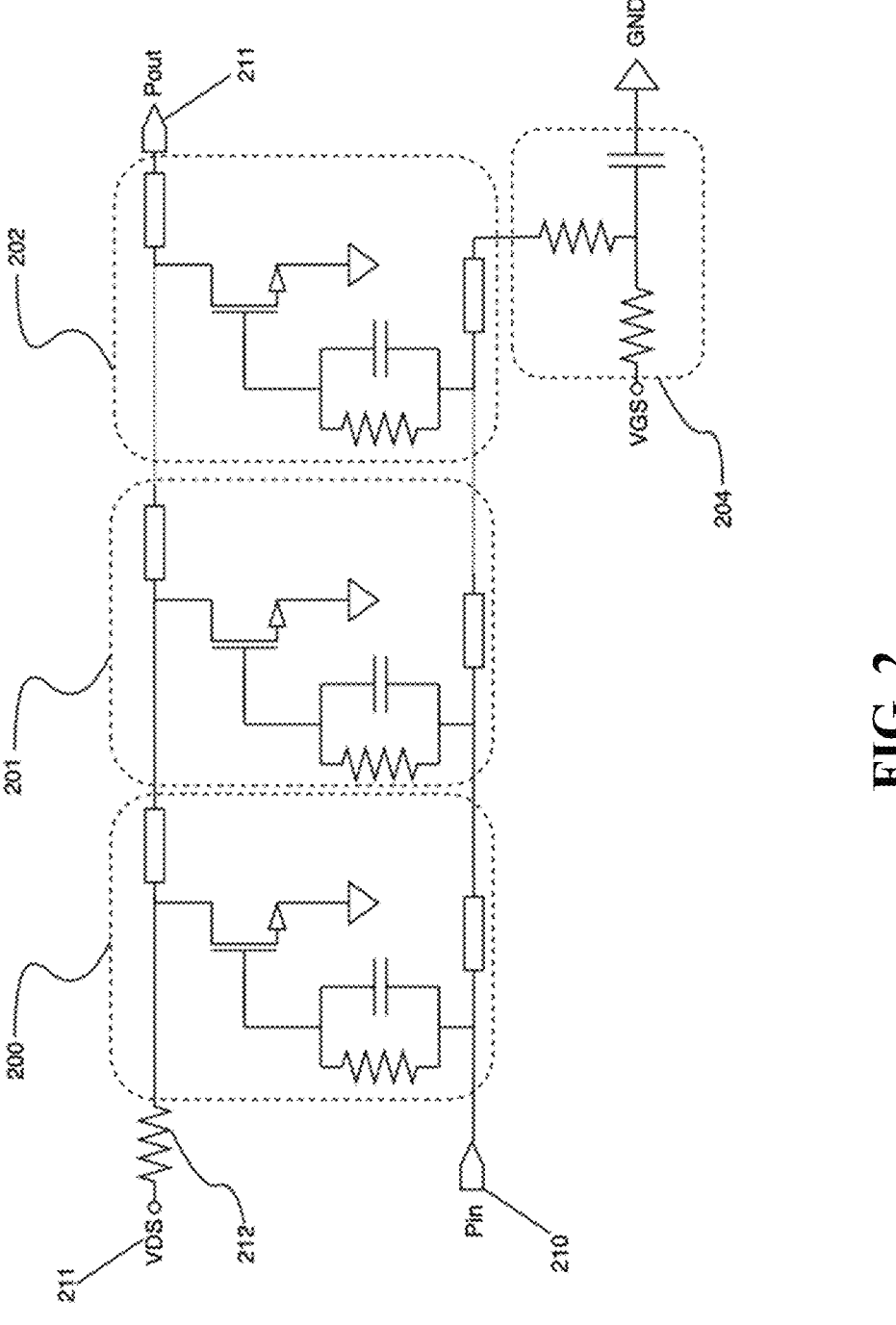
FIG. 2 show a schematic of N-cell non-uniform distributed power amplifier, according to some embodiments of the present disclosure.

FIG. 2 depicts the schematic of non-uniform distributed power amplifier with N cells. It could be naturally decomposed into N power amplifying units 200, 201 and 202, plus biasing components VDS 211 for providing drain node operating voltage via a resistor 212 and gate line biasing network 204. The input power signal is transmitted to the input end of Pin 210, amplified through all the cells 200, 201 and 202 in parallel. Finally, the power is combined on the output end Pout 211. The biasing circuits are out of the tuning task in MARL algorithm, simply because they are easier to design. For the main part of this schematic, each unit is represented as one agent in RL model, and two neighboring agents are connected via gate line and drain line.

Next, we define the reward r, action a, state s, the policy network architecture $\pi_\theta(a|s)$ parameterized by $\theta$ for each agent, and the state value network called "critic" parameterized by $\varnothing$, and finally the optimization method that we use to train these parameters.

Reward Function

We define the intermediate reward at timestep t as $R_t$, by a weighted sum of sub-rewards $r_i$, $$R_t = \Sigma_{i=1}^6 w^i * r^i, r^i = \min(\exp((g^i - g^*)/g^*), 1.2), \tag{1}$$

where $g^i$ is the i-th specification (current circuit specification) obtained under current policy, and $g^*$ is the ideal specification (desired circuit specification). This reward mapping encourages the agent to approach the goal with more reward due to the exponential function, and the value 1.2 (a free parameter) is the saturation value for discouraging too much overdesign once the specification is satisfied and encouraging robustness pursuit. Empirically, assigning different weights helps to guide the agent to pursuit the critical performance. We use the six SP simulation performance terms $g^*$: [$S21_{min}$, $S21_{mean}$, $S21_{variance}$, $S11_{mean}$, $S22_{mean}$, flatness], with the empirical weights [5, 0.5, 1, 1, 1, 1.5]. If all of them are fulfilled, the learning episode terminates, and the obtainable reward should be above 10.

Action Representation

Discrete action space is adopted in the algorithm, in the form of vector e.g., [−2, −1, 0, 1, 2], with the options of decrementing or incrementing by one or two units or keeping the device parameters unchanged. For instance, the decision of increasing the width of a transistor by one unit means $x+\Delta x$. The number of action options is a hyper parameter, determining how aggressively we expect the agent to act.

State Representation

The state used for individual agent policy learning contains two parts. The first is the device information, preprocessed as two concantenated vectors [$h_{type}$, $h_{para}$], where $h_{type}$ represents device types, e.g. the binary code [0, 0, 0] and [0, 0, 1] represent transistor and transmission line (TL) respectively. And $h_{para}$, is a two-bit device parameter, normalized by the upper bound of each specific parameter, and zero padding is used if the device has only one physical parameter, e.g. resistor only has resistance disregarding the width or length of a real resistor. For transmission lines, the algorithm tunes the width and length simultaneously.

The second part of state is intermediate SP simulation result for each cell, including SP measurements on drain and gate line, which is illustrated in details in the following paragraph.

Figure 3:
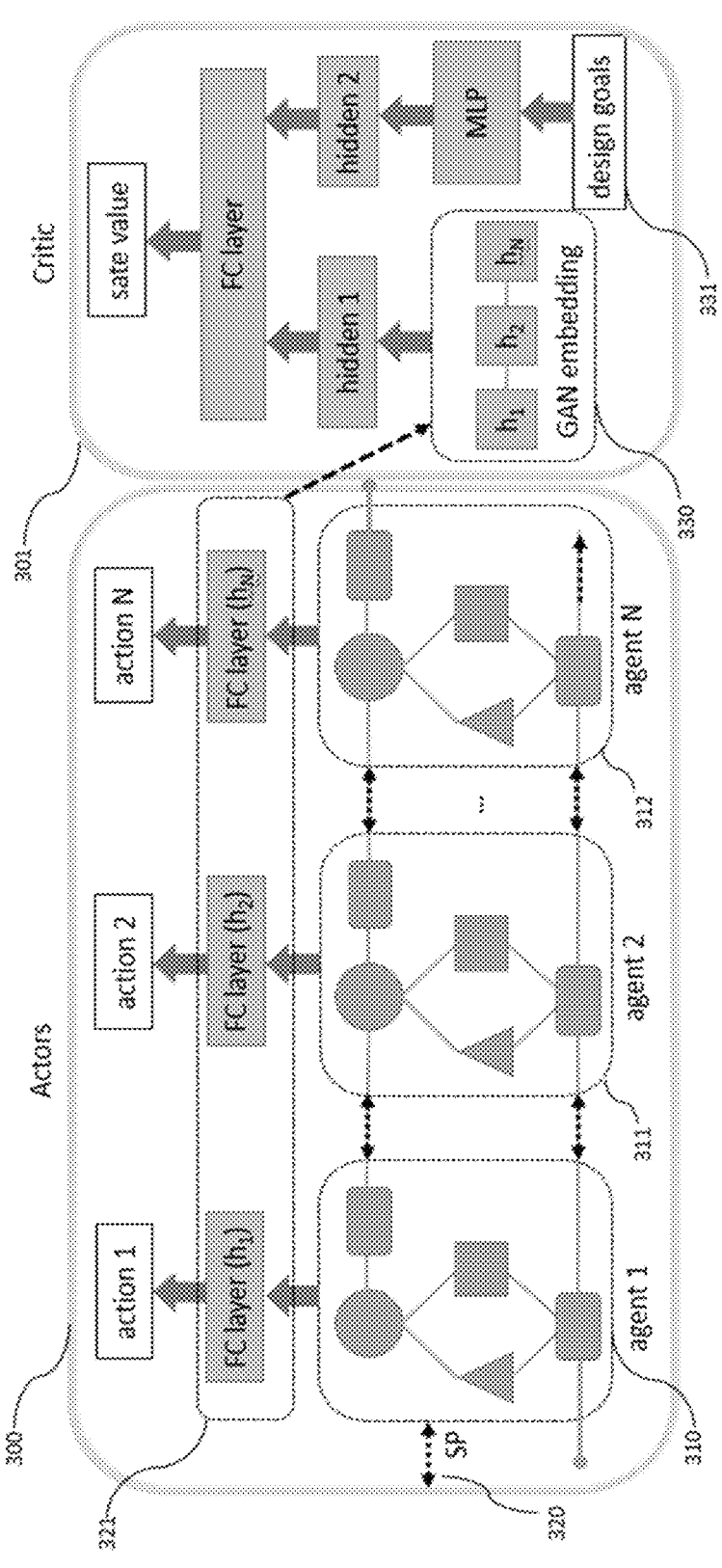
FIG. 3 shows a multi-agent RL model embedding based on actor-critic algorithm, according to some embodiments of the present disclosure.

Model Construction:

FIG. 3 presents the diagram of dual-level embedding for multi-agent reinforcement learning method, consists of two main components: Actors 300 and Critic 301. For clear illustration, we depict one benchmark graph embedding method as the example in this section. In specific, the low-level individual agent's is embedded by GCN and high-level embedding is realized by GAN. Specifically, cells 200, 201 and 202 in FIG. 2 are mapped to graphical models G(V, E) 310, 311, or 312 in FIG. 3, where each node V is a device and connection between devices is an edge E. In addition, we treat the biasing nodes $V_{DS}$, $V_{GS}$ and ground GND in all sub graphs as exactly the same. The SP simulation results 320 are refined as a set of vectors, including S21, S22 on drain line, and S11, S22 on gate line. According to the working frequency band (2 GHz~18 GHz) defined in specification, each SP term contains 17 sampled frequency points, with one point every 1 GHz in all the SP curves.

Figure 4:
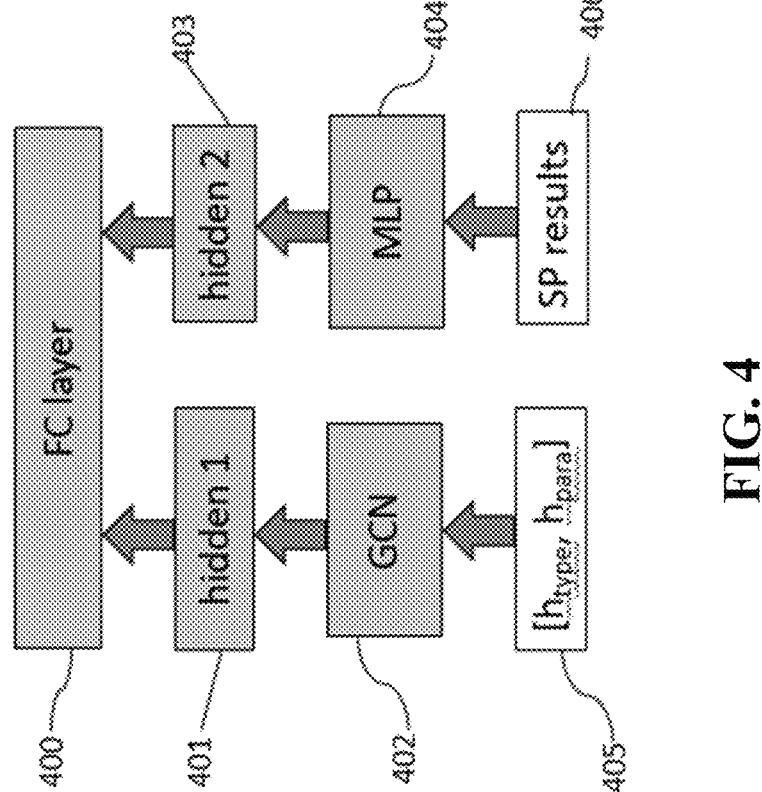
FIG. 4 Shows a policy network encoding for individual agent, according to some embodiments of the present disclosure.

FIG. 4 shows how the two types of state information are processed through a neural network. The device information 405 is fed through GCN model 402 and one hidden layer 401 to generate a bunch of hidden features. Similarly, the SP results 406 are fed through MLP (multiple layer perceptron) and another hidden layer 403, the obtained hidden feature is concatenated to the aforementioned hidden feature, then encoded by a fully-connected layer 400. The FC layer 400 is one specific example of 321 in FIG. 3.

The high-level GAN embedding is to approximate critic value 301, which is similar to low level-embedding in FIG. 4, but two major differences. One is that the node information is a vector of extracted feature from 321, with each feature for each agent. The second difference is the input of MLP embedding, which is replaced by the specification of design goal, also a concatenated SP samples, including S21, S11 and S22.

Interaction and Policy Learning Manner

As the adopted algorithm PPO is based on on-policy learning, one memory component to store recent experiences is initialized before the formal training. In the beginning of each episode, the all devices in the target circuit 200, 201 and 202 are parameterized, randomly or with pre-scheduled values, which depends on the strategy of RL algorithms handles the balance of exploration and exploitation. A corresponding netlist 111 is passed to EDA tool 112 for electrical simulation. The simulation results are processed by the data processor 113 to output meaningful results 121 as the feedback signal from the environment, e.g. the operation of frequency points sampling for low-level SP results 406 processing, or averaging SP for reward function formulation. After reading the current state $s_t$ and reward R, the agents 100 are expected to output actions 120 as the command of parameter tuning directions, so that a new netlist comes output after the parameters change, and the state goes to next state $s_{t+1}$. The tuple of ($s_t$, $a_t$, $R_t$, $s_{t+1}$, πt) is stored into the memory component as the agents interact with environment, note that πt is a set of actions probability distribution, quantifying how confident one specific action should be chosen as the optimal choice.

The common goal of the agents (i.e.) is to generate higher-quality decisions as it gains experience from searching for optimal device parameters, associated with desired specifications. We can formally define the objective function of the automated design of analog circuits as:

$$J(\theta, G) = \frac{1}{H}\sum_{g:G}E_{g,s:\pi_\theta}[R_{s,g}]. \tag{2}$$

Here, H is the space size of all desired specifications G and $R_{s,g}$ is the episode reward defined in Eq. (1). Given the cumulative reward for each episode, we use Proximal Policy Optimization (PPO) to update the parameters of agent-i's policy network with a clipped objective as shown below:

$$L^{clip}(\theta_i)=E_t[\min(b_{(i,t)}(\theta_i),\mathrm{clip}(b_{(i,t)}(\theta_i),1-\epsilon,1+\epsilon)A_t] \tag{3}$$

where $E_t$ represents the expected value at time step t; $b_{(i,t)}(\theta_i)=\pi(a|s;\theta_i)/\pi_{old}(a|s)$ is the ratio of new policy and old policy in terms of action probability distribution for agent i, $A_t$ is the global advantage function, calculated as $A_t=V\phi$ ($s_t$)−$G_t$, $G_t=\Sigma\gamma t*R(s,a)$, is discounted return in one episode.

The clipping technique is constraint for avoiding aggressive policy updating, with a small E=0.2. The estimation of VO(s) is learned by minimizing mean squared error of the two quantities, as formulated in the second loss function:

$$i.L^{VF}(\phi)=E_t[V\phi(s_t)-G_t]^2 \tag{4}$$

The two types of loss functions are minimized separately.

Model Training Procedure

Before each policy iteration, dozens of episodes of interactions need to be run for policy update, the record of interaction is stored into the memory component as described above. When comes to model parameters update, the episodic experiences are used for couple of times for stable learning. The training stops according to one predefined criterion, e.g. the averaged episodic reward is above 8, or 30% design goals could be reached within the maximum episode length, which is typically empirical.

Deployment Method

Once a MARL model is well trained, the system including the trained MARL model is configured to perform the design task which is associated with a new design goal. In deployment phase, given a new specification, which is sampled from the specification ranges covered in training phase, all agents are configured to make effort to pursuit optimal solution as fast as possible. Once all specifications are satisfied, it means this design task is successfully done by this automation design method. The metric of MARL capability is computing the percentage of accomplished automation design tasks.

Design Example

As a straightforward showcase, about how a 3-cell non-uniform distributed power amplifier automation design with the proposed MARL algorithm is implemented. FIG. 5 shows an example of specification (Scattering parameters or S-parameters) for 3-cell non-uniform distributed power amplifier according to some embodiments of the present disclosure. The second row in FIG. 5 lists the specifications, all in the metric of SP simulation terms. By convention, large signal simulation, such as Harmonic Balance, should be run in a RF power amplifier, but this is replaced by small signal simulation SP simulation, simply due to its shorter runtime. To guarantee the SP measurement can reflect real HB measurement, it is suggested setting SP specification a bit more restrictive than the corresponding HB's. The empirical setting is from the fact that typically small signal simulation is more optimistic than large signal simulation, because it ignores the significant parasitic effect, which potentially dominates in some devices.

Figure 6:
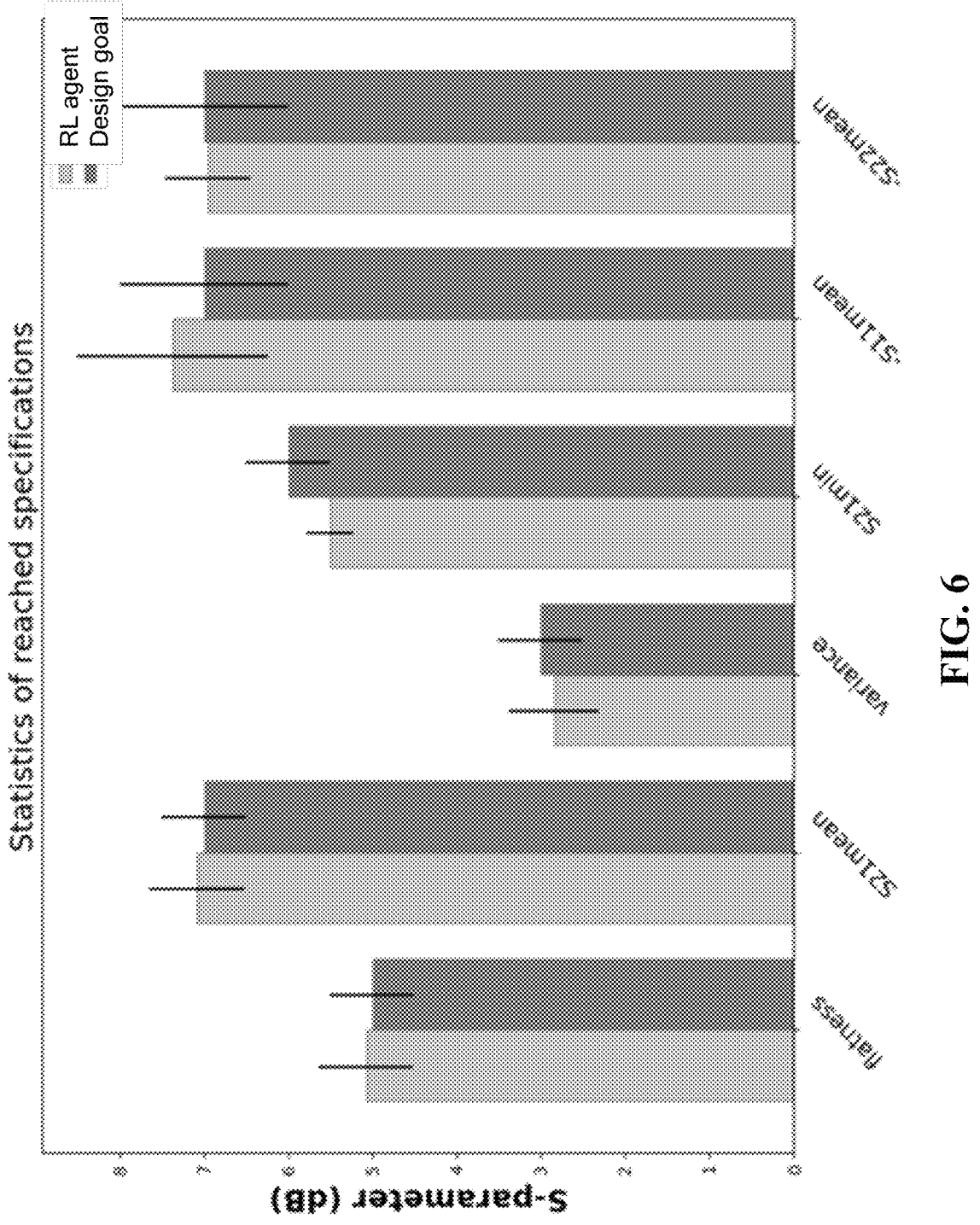
FIG. 6 shows a histogram of how much specifications are met after sufficient training in MARL, according to some embodiments of the present disclosure
Figure 7:
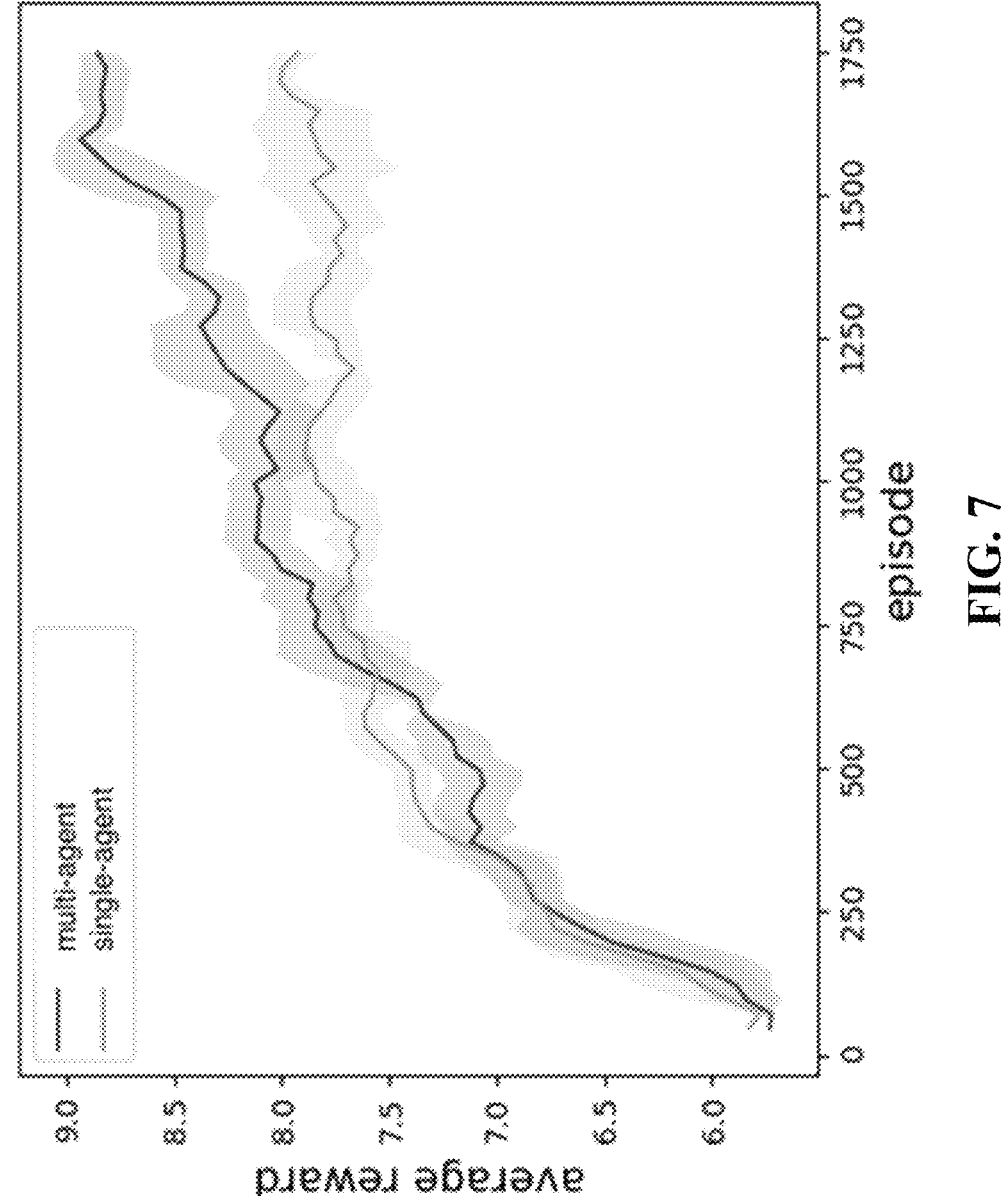
FIG. 7 shows the comparison of training results with single-agent RL and multi-agent RL for 3-cell NDPA, according to some embodiments of the present disclosure.

FIG. 6 shows with histogram of how much specifications are met after sufficient training in MARL, compared with defined specification in FIG. 5. It shows that FIG. 7 shows the comparison of training results with single-agent RL and multi-agent RL for 3-cell NDPA.

Figure 8:
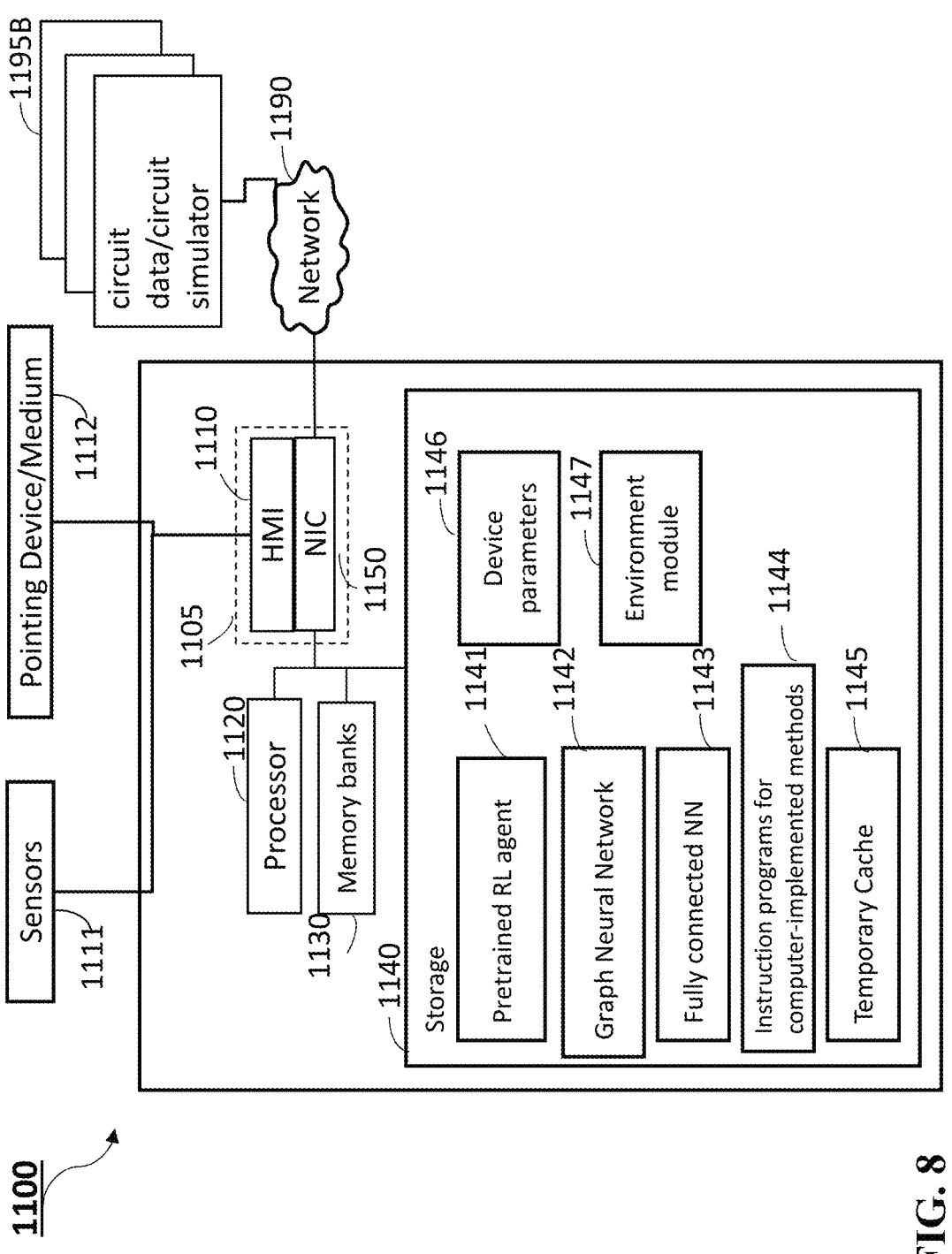
FIG. 8 shows a schematic of a system configured with processor, memory coupled with a storage storing computer-implemented methods, according to some embodiments of the present disclosure.

FIG. 8 is a schematic of a system 1100 configured with processor 1120, memory 1120 coupled with a storage 1140 storing computer-implemented methods, and interface 1105 according to some embodiments of the present disclosure.

FIG. 8 illustrates a block diagram illustrating an example of a system 1100 for automated construction of an artificial neural network architecture. The system 1100 includes a set of interfaces and data links 1105 configured to receive and send signals, at least one processor 1120, a memory (or a set of memory banks) 1130 and a storage 1140. The processor 1120 performs, in connection with the memory 1130, computer-executable programs and algorithms stored in the storage 1140. The set of interfaces and data links 1105 may include a human machine interface (HMI) 1110 and a network interface controller 1150. The processor 1120 can perform the computer-executable programs and algorithms in connection with the memory 1130 that uploads the computer-executable programs and algorithms from the storage 1140. The computer-executable programs and algorithms stored in the storage 1140 may be a pretrained RL agent (neural network) 1141, a graph neural network 1142, fully connected neural network 1143, the instructions for performing computer-implemented method (programs) 1144, temporary caches 1145, device parameters 1146, and an environment module 1147.

The device parameters may be structures of a transistor. For instance, the device parameters may include gate widths, gate lengths, a number of figures of a transistor, capacitance. The desired specifications may be gain (G), bandwidth (B), phase margin (P M), power consumption (P), power efficiency (E) and output power (P).

The system 1100 can receive the signals via the set of interfaces and data links. The signals can be datasets of training data, desired circuit description data and testing data including gain, bandwidth, phase margin, power consumption, output power and power efficiency.

The at least one processor 1120 is configured to, in connection with the interface and the memory banks 1105, submit the signals and the datasets into the reconfigurable DNN blocks 1141. The system 1100 may receive circuit data or perform the circuit simulating with associated computing system 1195B via a network 1190 and the set of interfaces and data links 1105.

Comparison with Single-Agent RL Method

There have emerged several existing relevant works, showing that RL-based automation design method can learn the policy in both analog and RF circuits design. However, all these prior works do not perform capability of handling more complex circuit topologies with dozens of devices, or more complicated frequency related and signal amplitude related correlations, which is a usual challenge in RF circuits design due to ubiquitous parasitic. Additionally, circuits with scalable structures like distributed power amplifier are never touched by intelligent algorithms, even though the optimal design has been long-standing hard since it was invented. Our MARL method is a brand-new and well-suited candidate to model the scalability of this such topology. The intuition is a compact individual agent working as local state observer and learner, is able to focus more on the local complexity, enabling the learning more efficient than a traditional single-agent counterpart, wherein a huge approximator has to capture the entire story of given topology, inducing redundancy. More importantly, the coupling effect among agents is grasped appropriately by high-level agents networking manner (a graphical mapping in the proposed embodiment), which is abstract but effective in estimating direct or indirect coupling effect, also coincident with design theory.

Our framework also demonstrates a good generalization ability, i.e., generating optimal design parameters for unseen targets. We believe that our method can assist IC industry to accelerate the analog chip design, with artificial agents that could accumulate a massive circuitry optimization experiences via continuous training.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

The above-described embodiments of the present disclosure can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Also, the embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments. Further, use of ordinal terms such as first, second, in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

The invention claimed is:

1. A computer-implemented method for training a multi-agent reinforcement learning (RL) network generating device parameters of circuits, wherein the method uses a processor coupled with a memory storing instructions implementing the method, wherein the instructions, when executed by the processor, carry out at steps of the method, comprising:

acquiring inputs with respect to a desired circuit specification of a circuit, device parameters of the circuit, a topology of the circuit, a final state corresponding to a maximum step, wherein the desired circuit specification is represented by a gain, bandwidth, phase margin, power consumption, output power and power efficiency, or part of combination thereof;

decomposing the circuit into a plurality of amplifying units, each amplifying unit is modeled as an agent in the multi-agent RL network, wherein each agent of the multi-agent RL network is configured to perform steps of:

transmitting an action selected from a set of actions to an environment module that includes a netlist of the circuit;

updating the device parameters of the circuit with respect to the desired circuit specification according to the selected action using a data processor of the environment module, wherein the action changes each of the device parameters by a minimum unit value of each device parameter;

obtaining a current circuit specification of the circuit by simulating the netlist of the circuit based on the updated device parameters using a circuit simulator of the environment module;

acquiring a reward from the environment module, wherein the reward is computed based on a difference between the current circuit specification and the desired circuit specification, and a policy of each agent is updated based on the reward and a state value of the circuit that is estimated by a shared graphical attention network based on the desired circuit specification and features extracted from all agents of the multi-agent RL network, wherein the steps of the transmitting, updating, obtaining and acquiring are continued until the reward reaches to a threshold value or a number of the steps reach a preset value; and storing the updated device parameters into the memory.

2. The method of claim 1, wherein the circuit is modeled by a graph G(V, E), wherein each node V is represented by a device, wherein an edge E represents a connection between devices.

3. The method of claim 1, wherein the power supply (VP), ground (VGND), and other DC bias voltages in the topology of the circuit are represented as extra nodes V.

4. The method of claim 1, wherein the reward is calculated by a weighted sum of the desired specification by assigning different value of the weighting factor.

5. The method of claim 1, wherein the multi-agent RL network includes a graph neural network (GNN) and a fully connected neural network (FCNN).

6. The method of claim 5, wherein the FCNN embeds the desired specifications of the circuit, and the GNN embeds the circuit topology and parameters.

7. A computer-implemented method for generating device parameters of circuits using a pretrained multi-agent reinforcement learning (RL) network, wherein the method uses a processor coupled with a memory storing instructions implementing the method, wherein the instructions, when executed by the processor, carry out at steps of the method, comprising:

acquiring, via an interface, inputs with respect to a desired specification of a circuit, device parameters, a topology of the circuit, wherein the circuit corresponds a distributed circuit including a plurality of amplifying units, each amplifying unit is modeled as an agent in the pretrained multi-agent RL network;

providing the inputs to the pretrained multi-agent RL network, wherein each of the desired circuit specification is represented by gain, bandwidth, phase margin, power consumption, output power and power efficiency, wherein a policy of each agent is based on a reward computed based on a difference between current circuit specification and the desired circuit specification and a state value of the circuit that is estimated by a shared graphical attention network based on the desired circuit specification and features extracted from all agents of the multi-agent RL network; and generating a circuit represented by a graph modeling the topology of the circuit and the device parameters of the circuit, updated device parameters of the circuit.

* * * * *